US011277121B1

(12) United States Patent
Goyal et al.

(10) Patent No.: US 11,277,121 B1
(45) Date of Patent: Mar. 15, 2022

(54) LEVEL SHIFTER (71) Applicant: NXP B.V., Eindhoven (NL)

(72) Inventors: Saurabh Goyal, Sonipat (IN); Divya Tripathi, Noida (IN); Sanjay Kumar Wadhwa, Noida (IN)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/161,083

(22) Filed: Jan. 28, 2021

(51) Int. Cl.
| | |
|---|---|
| H03K 17/687 | (2006.01) |
| H03K 19/00 | (2006.01) |
| H03K 19/0175 | (2006.01) |
| H03K 19/0185 | (2006.01) |
| H03K 3/356 | (2006.01) |
| H03K 19/003 | (2006.01) |
| H03K 17/10 | (2006.01) |

(52) U.S. Cl.
CPC ..... *H03K 3/356113* (2013.01); *H03K 17/102* (2013.01); *H03K 19/00315* (2013.01); *H03K 19/018521* (2013.01)

(58) Field of Classification Search
None
See application file for complete search history.

(56) References Cited

U.S. PATENT DOCUMENTS

| | | | |
|---|---|---|---|
| 5,969,542 A | 10/1999 | Maley et al. | |
| 6,963,226 B2 * | 11/2005 | Chiang | H03K 3/356113 326/68 |
| 7,102,410 B2 | 9/2006 | Khan et al. | |
| 7,112,998 B2 * | 9/2006 | Ajit | H03K 19/00315 326/63 |
| 7,215,146 B2 * | 5/2007 | Khan | H03K 3/356113 326/68 |
| 7,768,308 B2 * | 8/2010 | Maede | H03K 3/356113 326/68 |
| 7,804,350 B1 * | 9/2010 | Edmondson | H03K 3/356113 327/333 |
| 8,373,485 B2 * | 2/2013 | Po | H03K 3/356182 327/333 |
| 8,854,104 B2 * | 10/2014 | Chung | H03K 19/018521 327/333 |
| 9,484,922 B2 * | 11/2016 | Malkov | H03K 5/15 |
| 9,503,091 B2 * | 11/2016 | Kirihata | G11C 16/12 |
| 10,186,958 B2 * | 1/2019 | Roth | H02M 3/155 |
| 10,924,115 B2 * | 2/2021 | Huang | H03K 3/356086 |

* cited by examiner

*Primary Examiner* — Kenneth B Wells (57) ABSTRACT

A level shifter includes a pull-down circuit, a pull-up circuit, a protection circuit, and an output generator. The pull-down circuit is configured to receive input voltages, and generate bias voltages. The input voltages are associated with a voltage domain. The pull-up circuit is configured to receive a supply voltage and generate control voltages. The protection circuit is configured to receive reference voltages, and control the generation of the bias voltages and the control voltages. The output generator is configured to receive at least one of the reference voltages, and at least one of the bias voltages and the control voltages, and generate output voltages that are able to reach minimum and maximum voltage levels of another voltage domain. Further, the output voltages remain unaffected by variations in process, voltage, and temperature.

21 Claims, 4 Drawing Sheets

LEVEL SHIFTER

BACKGROUND

The present disclosure relates generally to electronic circuits, and, more particularly, to a level shifter.

A system-on-chip (SoC) includes multiple components that operate under various voltage domains, i.e., voltages that are in a peculiar range (such as, '0-1.8' volts). A level shifter is used as an interface between the components to shift voltage levels of input voltages associated with one voltage domain to voltage levels of output voltages associated with another voltage domain.

A conventional level shifter includes pull-up and pull-down circuits and a voltage protection circuit. The voltage protection circuit protects gate-to-source and drain-to-source voltages of transistors of the pull-up and pull-down circuits from reaching high voltages that may damage the transistors. Thus, the output voltages generated by the conventional level shifter are unable to reach minimum and maximum voltage levels of the other voltage domain. Further, the output voltages vary due to variations in process, voltage, and temperature (PVT) associated with the conventional level shifter. To reduce the effects of PVT variations on the output voltages, large-sized transistors are implemented in the voltage protection circuit. Inclusion of such large-sized transistors results in an increase in a size of the conventional level shifter and a degradation in a speed of operation of the conventional level shifter. Therefore, there exists a need for a level shifter that solves the aforementioned problems of the conventional level shifter.

SUMMARY

In one embodiment, a level shifter is disclosed. The level shifter comprises a pull-down circuit, a pull-up circuit, a protection circuit, and an output generator. The pull-down circuit is configured to receive first and second input voltages, and generate first and second bias voltages. The first and second input voltages are associated with a first voltage domain. The pull-up circuit is configured to receive a supply voltage and generate first and second control voltages. The protection circuit is coupled between the pull-down circuit and the pull-up circuit, and configured to receive first and second reference voltages, and control the generation of the first and second bias voltages and the first and second control voltages. The output generator is coupled with the pull-down circuit and the protection circuit, and configured to receive the second reference voltage and the first and second bias voltages, and generate first and second output voltages. The first and second output voltages are associated with a second voltage domain.

In another embodiment, a level shifter is disclosed. The level shifter comprises a pull-down circuit, a pull-up circuit, a protection circuit, and an output generator. The pull-down circuit is configured to receive first and second input voltages, and generate first and second bias voltages. The first and second input voltages are associated with a first voltage domain. The pull-up circuit is configured to receive a supply voltage and generate first and second control voltages. The protection circuit is coupled between the pull-down circuit and the pull-up circuit, and configured to receive first and second reference voltages, and control the generation of the first and second bias voltages and the first and second control voltages. The output generator is coupled with the pull-down circuit, the pull-up circuit, and the protection circuit, and configured to receive the first and second reference voltages, the first and second bias voltages, and the first and second control voltages, and generate first through fourth output voltages. The first and second output voltages are associated with a second voltage domain, and the third and fourth output voltages are associated with a third voltage domain.

In yet another embodiment, a system-on-chip (SoC) is disclosed. The SoC includes a core and a level shifter that is coupled with the core. The core is configured to receive a first supply voltage and generate first and second input voltages. The first and second input voltages are associated with a first voltage domain. The level shifter comprises a pull-down circuit, a pull-up circuit, a protection circuit, and an output generator. The pull-down circuit is configured to receive the first and second input voltages, and generate first and second bias voltages. The pull-up circuit is configured to receive a second supply voltage and generate first and second control voltages. The protection circuit is coupled between the pull-down circuit and the pull-up circuit, and configured to receive first and second reference voltages, and control the generation of the first and second bias voltages and the first and second control voltages. The output generator is coupled with the pull-up circuit, the pull-down circuit, and the protection circuit, and configured to receive the first and second bias voltages and one of (i) the second reference voltage and (ii) the first and second reference voltages and the first and second control voltages, and generate a plurality of output voltages. The plurality of output voltages are associated with at least one of second and third voltage domains.

In some embodiments, the pull-down circuit includes first and second transistors. The first transistor has a gate terminal configured to receive the first input voltage, a source terminal coupled with a ground terminal, and a drain terminal configured to generate the first bias voltage. The second transistor has a gate terminal configured to receive the second input voltage, a source terminal coupled with the ground terminal, and a drain terminal configured to generate the second bias voltage.

In some embodiments, the pull-up circuit includes first and second transistors. The first transistor has a gate terminal configured to receive the second control voltage, a source terminal configured to receive the supply voltage, and a drain terminal configured to generate the first control voltage. The second transistor has a gate terminal coupled with the drain terminal of the first transistor, and configured to receive the first control voltage. The second transistor further has a source terminal configured to receive the supply voltage, and a drain terminal coupled with the gate terminal of the first transistor, and configured to generate and provide the second control voltage to the gate terminal of the first transistor.

In some embodiments, the protection circuit includes first through fourth transistors. The first transistor has a gate terminal configured to receive the first reference voltage, and a source terminal coupled with the pull-up circuit, and configured to control the generation of the first control voltage. The second transistor has a gate terminal configured to receive the first reference voltage, and a source terminal coupled with the pull-up circuit, and configured to control the generation of the second control voltage. The third transistor has a gate terminal configured to receive the second reference voltage, and a source terminal coupled with the pull-down circuit, and configured to control the generation of the first bias voltage. The third transistor further has a drain terminal coupled with a drain terminal of the first transistor. The fourth transistor has a gate terminal configured to receive the second reference voltage, and a source terminal coupled with the pull-down circuit, and configured to control the generation of the second bias voltage. The fourth transistor further has a drain terminal coupled with a drain terminal of the second transistor.

In some embodiments, the output generator includes first and second transistors. The first transistor has a gate terminal coupled with the pull-down circuit and the protection circuit, and configured to receive the second bias voltage. The first transistor further has a source terminal configured to receive the second reference voltage, and a drain terminal configured to generate the first output voltage. The second transistor has a gate terminal coupled with the drain terminal of the first transistor, the pull-down circuit, and the protection circuit, and configured to receive the first bias voltage. The second transistor further has a source terminal configured to receive the second reference voltage, and a drain terminal coupled with the gate terminal of the first transistor, and configured to generate the second output voltage.

In some embodiments, the level shifter further comprises a voltage divider network that is coupled with the protection circuit and the output generator. The voltage divider is configured to receive the supply voltage, generate the first and second reference voltages, and provide the first and second reference voltages to the protection circuit, and the second reference voltage to the output generator.

In some embodiments, the voltage divider network includes first through third resistors coupled in series. The first resistor is configured to receive the supply voltage, and the third resistor is coupled with a ground terminal. The first and second reference voltages are generated based on a voltage drop across each of the first through third resistors.

In some embodiments, the level shifter further comprises a resistor and a capacitor. The resistor is coupled with the voltage divider network, and configured to receive the second reference voltage. The capacitor is coupled with the resistor and a ground terminal, and configured to charge to the second reference voltage.

Various embodiments of the present disclosure disclose a level shifter. The level shifter comprises a pull-down circuit, a pull-up circuit, a protection circuit, and an output generator. The pull-down circuit is configured to receive input voltages, and generate bias voltages. The input voltages are associated with a voltage domain. The pull-up circuit is configured to receive a supply voltage and generate control voltages. The protection circuit is configured to receive reference voltages, and control the generation of the bias voltages and the control voltages. The output generator is configured to receive the bias voltages and one of the reference voltages, and generate output voltages. The output voltages are associated with another voltage domain.

The output voltages are generated by the output generator such that the output voltages are able to reach minimum and maximum voltage levels of the other voltage domain, and the output voltages do not vary due to variations in process, voltage, and temperature (PVT) associated with the level shifter. Additionally, a need to utilize large-sized transistors in the protection circuit is eliminated. Thus, a size of the level shifter is reduced and a speed of operation of the level shifter is increased as compared to conventional level shifters that utilize large-sized transistors in a protection circuit of the conventional level shifters.

BRIEF DESCRIPTION OF THE DRAWINGS

The following detailed description of the preferred embodiments of the present disclosure will be better understood when read in conjunction with the appended drawings.

The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
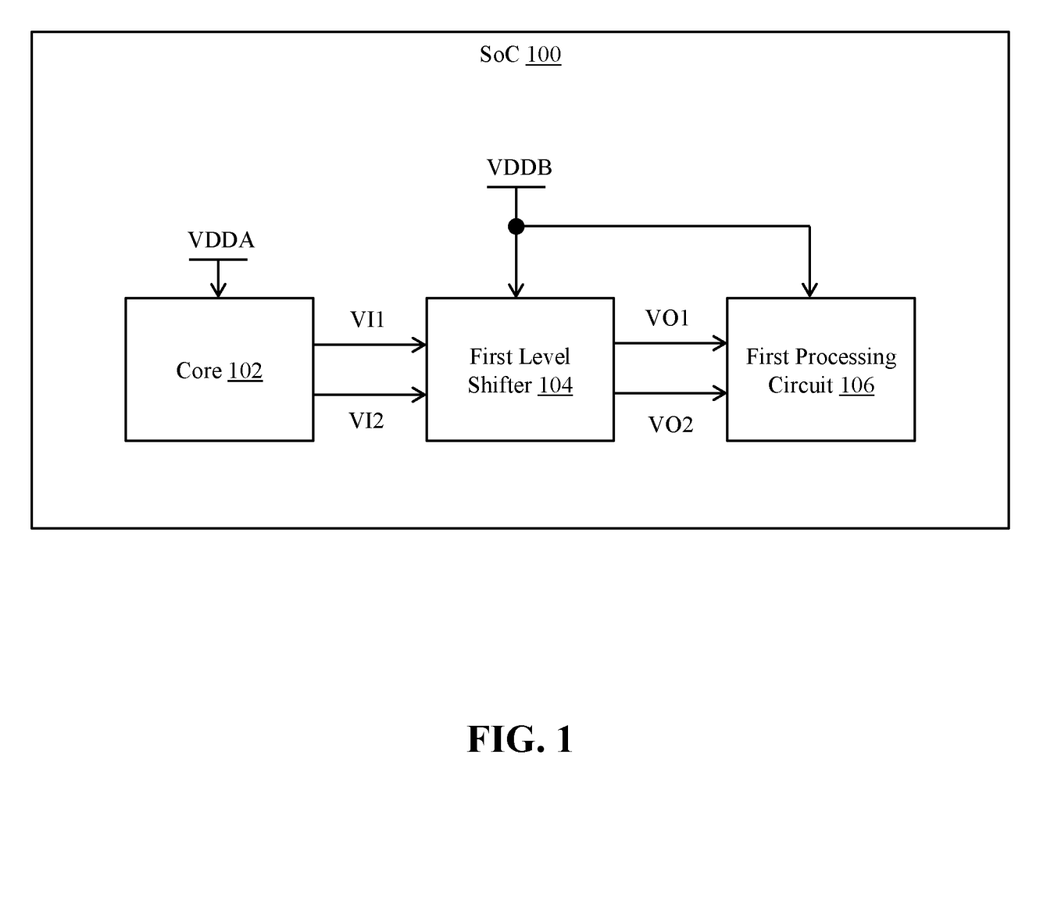
FIG. 1 is a schematic block diagram of a system-on-chip (SoC) in accordance with an embodiment of the present disclosure.

FIG. 1 is a schematic block diagram of a system-on-chip (SoC) 100 in accordance with an embodiment of the present disclosure. The SoC 100 may be utilized in applications that require different components of the SoC 100 to operate in different voltage domains. The SoC 100 includes a core 102, a first level shifter 104, and a first processing circuit 106.

The core 102 is a processing element of the SoC 100, and configured to receive a first supply voltage VDDA and generate first and second input voltages VI1 and VI2. In one embodiment, a first supply generator (not shown) is coupled with the core 102, and configured to generate and provide the first supply voltage VDDA to the core 102. The first supply generator may be included on the SoC 100. The core 102 is further configured to operate at the first supply voltage VDDA. The first and second input voltages VI1 and VI2 are associated with a first voltage domain. In one example, the first voltage domain corresponds to voltages in the range of '0-0.75' volts. Examples of the core 102 include, but are not limited to, a microprocessor core and a microcontroller core.

The first level shifter 104 is coupled with the core 102, and configured to receive a second supply voltage VDDB and the first and second input voltages VI1 and VI2, and shift voltage levels of the first and second input voltages VI1 and VI2 to generate first and second output voltages VO1 and VO2. In one embodiment, a second supply generator (not shown) is coupled with the first level shifter 104, and configured to generate and provide the second supply voltage VDDB to the first level shifter 104. The second supply generator may be included on the SoC 100. The first level shifter 104 is further configured to operate at the second supply voltage VDDB. In one example, the second supply voltage VDDB is '1.8' volts. The first and second output voltages VO1 and VO2 are associated with a second voltage domain. In one example, the second voltage domain corresponds to voltages in the range of '0-1.65' volts. The first level shifter 104 has been explained in detail in FIG. 2.

The first processing circuit 106 is coupled with the first level shifter 104, and configured to receive the first and second output voltages VO1 and VO2. The first processing circuit 106 is further coupled with the second supply generator, and further configured to receive the second supply voltage VDDB. In one example, the first processing circuit 106 includes a switching transistor (not shown) such that a gate terminal of the switching transistor is configured to receive one of the first and second output voltages VO1 and VO2 for controlling a switching operation of the switching transistor.

Figure 2:
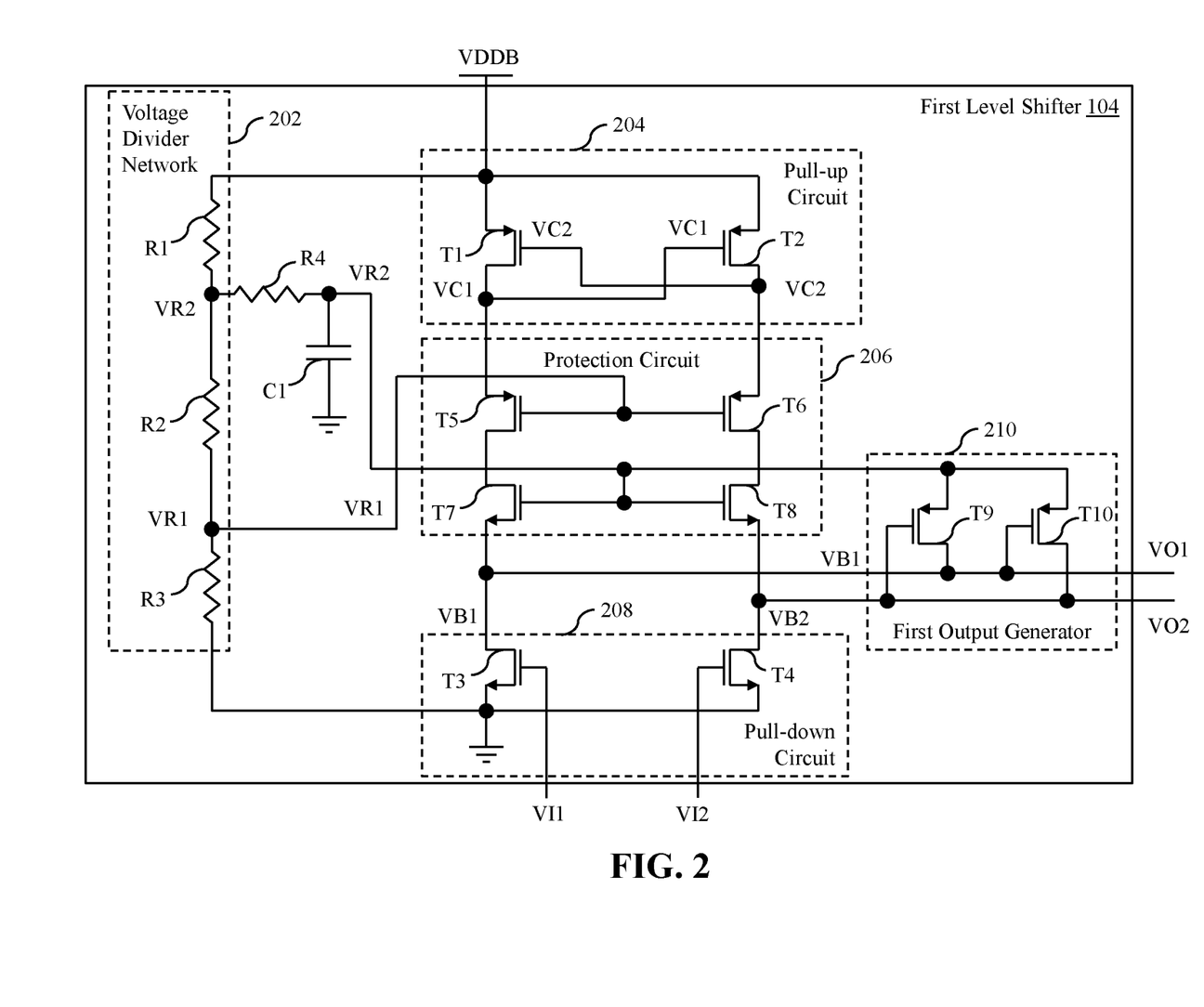
FIG. 2 is a schematic block diagram of a first level shifter of the SoC of FIG. 1 in accordance with an embodiment of the present disclosure.

FIG. 2 is a schematic block diagram of the first level shifter 104 in accordance with an embodiment of the present disclosure. The first level shifter 104 includes a voltage divider network 202 that includes first through third resistors R1-R3 coupled in series, a fourth resistor R4, a first capacitor C1, a pull-up circuit 204, a protection circuit 206, a pull-down circuit 208, and a first output generator 210.

The voltage divider network 202 is coupled with the second supply generator, and configured to receive the second supply voltage VDDB and generate first and second reference voltages VR1 and VR2. The first resistor R1 is configured to receive the second supply voltage VDDB whereas the third resistor R3 is coupled with a ground terminal. The second resistor R2 is coupled between the first and third resistors R1 and R3. The first and second reference voltages VR1 and VR2 are generated based on a voltage drop across each of the first through third resistors R1-R3. The first reference voltage VR1 is generated between the second and third resistors R2 and R3, and the second reference voltage VR2 is generated between the first and second resistors R1 and R2. The voltage divider network 202 is further coupled with the protection circuit 206 and the first output generator 210, and further configured to provide the first and second reference voltages VR1 and VR2 to the protection circuit 206, and the second reference voltage VR2 to the first output generator 210.

The fourth resistor R4 is coupled with the voltage divider network 202, and configured to receive the second reference voltage VR2. The first capacitor C1 is coupled with the fourth resistor R4 and the ground terminal, and configured to charge to the second reference voltage VR2. The fourth resistor R4 and the first capacitor C1 are utilized to prevent back coupling of the first and second output voltages VO1 and VO2 due to transitions in the first and second output voltages VO1 and VO2.

The pull-up circuit 204 is configured to receive the second supply voltage VDDB and generate first and second control voltages VC1 and VC2. The pull-up circuit 204 includes first and second transistors T1 and T2. The first transistor T1 has a source terminal that is coupled with the second supply generator, and configured to receive the second supply voltage VDDB. The first transistor T1 further has a gate terminal that is configured to receive the second control voltage VC2, and a drain terminal that is configured to generate the first control voltage VC1. The first control voltage VC1 is thus generated based on the second supply voltage VDDB and the second control voltage VC2. The second transistor T2 has a gate terminal that is coupled with the drain terminal of the first transistor T1, and configured to receive the first control voltage VC1. The second transistor T2 further has a source terminal that is coupled with the second supply generator, and a drain terminal that is coupled with the gate terminal of the first transistor T1. The source terminal of the second transistor T2 is configured to receive the second supply voltage VDDB, and the drain terminal of the second transistor T2 is configured to generate and provide the second control voltage VC2 to the gate terminal of the first transistor T1. The second control voltage VC2 is thus generated based on the second supply voltage VDDB and the first control voltage VC1. In one example, the first and second transistors T1 and T2 are p-channel metal oxide semiconductor (PMOS) transistors.

The pull-down circuit 208 is coupled with the core 102, and configured to receive the first and second input voltages VI1 and VI2, and generate first and second bias voltages VB1 and VB2. The pull-down circuit 208 includes third and fourth transistors T3 and T4. The third transistor T3 has a gate terminal that is coupled with the core 102, and a source terminal coupled with a ground terminal. The gate terminal of the third transistor T3 is configured to receive the first input voltage VIE The third transistor T3 further has a drain terminal that is configured to generate the first bias voltage VB1. The fourth transistor T4 has a gate terminal that is coupled with the core 102, and a source terminal that is coupled with the ground terminal. The gate terminal of the fourth transistor T4 is configured to receive the second input voltage VI2. The fourth transistor T4 further has a drain terminal that is configured to generate the second bias voltage VB2. In one example, the third and fourth transistors T3 and T4 are n-channel metal oxide semiconductor (NMOS) transistors.

The protection circuit 206 is coupled with the voltage divider network 202, the fourth resistor R4, and the first capacitor C1, and configured to receive the first and second reference voltages VR1 and VR2. The protection circuit 206 is further coupled between the pull-down circuit 208 and the pull-up circuit 204, and further configured to control the generation of the first and second bias voltages VB1 and VB2 and the first and second control voltages VC1 and VC2. The protection circuit 206 includes fifth through eighth transistors T5-T8. The fifth transistor T5 has a gate terminal that is coupled with the second and third resistors R2 and R3, and configured to receive the first reference voltage VR1. The fifth transistor T5 further has a source terminal that is coupled with the pull-up circuit 204 (i.e., the drain terminal of the first transistor T1), and configured to control the generation of the first control voltage VC1. Based on the first reference voltage VR1 received at the gate terminal of the fifth transistor T5, the first control voltage VC1 flows from the source terminal of the fifth transistor T5 to a drain terminal of the fifth transistor T5.

The sixth transistor T6 has a gate terminal that is coupled with the second and third resistors R2 and R3, and configured to receive the first reference voltage VR1. The sixth transistor T6 further has a source terminal that is coupled with the pull-up circuit 204 (i.e., the drain terminal of the second transistor T2), and configured to control the generation of the second control voltage VC2. Based on the first reference voltage VR1 received at the gate terminal of the sixth transistor T6, the second control voltage VC2 flows from the source terminal of the sixth transistor T6 to a drain terminal of the sixth transistor T6. In one example, when the first reference voltage VR1 is '0.35' volts and the second control voltage VC2 is '1.8' volts, the fifth transistor T5 controls the generation of the first control voltage VC1 such that the first control voltage VC1 is '0.35+Vt' volts, where 'Vt' is a threshold voltage associated with the fifth transistor T5. Further, the second transistor T2 receives the first control voltage VC1 at the gate terminal thereof and thus a gate-to-source voltage (not shown) of the second transistor T2 is '1.45−Vt' volts. Additionally, the first transistor T1 receives the second supply voltage VDDB, i.e., '1.8' volts, at the source terminal thereof and thus a drain-to-source voltage (not shown) of the first transistor T1 is '1.45−Vt' volts. Thus, the fifth transistor T5 is further configured to protect the drain-to-source voltage and the gate-to-source voltage of the first and second transistors T1 and T2, respectively, from reaching a high voltage, i.e., '1.8' volts, that may damage the first and second transistors T1 and T2. Similarly, the sixth transistor T6 is further configured to protect a gate-to-source voltage and a drain-to-source voltage of the first and second transistors T1 and T2, respectively, from reaching the high voltage of 1.8 volts. In one example, the fifth and sixth transistors T5 and T6 are PMOS transistors.

The seventh transistor T7 has a gate terminal that is coupled with the fourth resistor R4 and the first capacitor C1, and configured to receive the second reference voltage VR2. The seventh transistor T7 further has a source terminal that is coupled with the pull-down circuit 208 (i.e., the drain terminal of the third transistor T3), and a drain terminal that is coupled with the drain terminal of the fifth transistor T5. The source terminal of the seventh transistor T7 is configured to control the generation of the first bias voltage VB1. Based on the second reference voltage VR2 received at the gate terminal of the seventh transistor T7, the first bias voltage VB1 flows from the source terminal of the seventh transistor T7 to the drain terminal of the seventh transistor T7. The eighth transistor T8 has a gate terminal that is coupled with the fourth resistor R4 and the first capacitor C1, and configured to receive the second reference voltage VR2. The eighth transistor T8 further has a source terminal that is coupled with the pull-down circuit 208 (i.e., the drain terminal of the fourth transistor T4), and a drain terminal coupled with the drain terminal of the sixth transistor T6. The source terminal of the eighth transistor T8 is configured to control the generation of the second bias voltage VB2. Based on the second reference voltage VR2 received at the gate terminal of the eighth transistor T8, the second bias voltage VB2 flows from the source terminal of the eighth transistor T8 to the drain terminal of the eighth transistor T8. The seventh and eighth transistors T7 and T8 are further configured to protect gate-to-source voltages and drain-to-source voltages of the third and fourth transistors T3 and T4 from reaching high voltages that may damage the third and fourth transistors T3 and T4. In one example, the seventh and eighth transistors T7 and T8 are NMOS transistors.

The first output generator 210 is coupled with the fourth resistor R4, the first capacitor C1, the pull-down circuit 208, and the protection circuit 206, and configured to receive the second reference voltage VR2 and the first and second bias voltages VB1 and VB2, and generate the first and second output voltages VO1 and VO2. The first output generator 210 includes ninth and tenth transistors T9 and T10. The ninth transistor T9 has a gate terminal that is coupled with the pull-down circuit 208 (i.e., the drain terminal of the fourth transistor T4) and the protection circuit 206 (i.e., the source terminal of the eighth transistor T8), and configured to receive the second bias voltage VB2. The ninth transistor T9 further has a source terminal that is coupled with the fourth resistor R4 and the first capacitor C1, and configured to receive the second reference voltage VR2. The ninth transistor T9 further has a drain terminal that is configured to generate the first output voltage VO1.

The tenth transistor T10 has a gate terminal that is coupled with the drain terminal of the ninth transistor T9, the pull-down circuit 208 (i.e., the drain terminal of the third transistor T3), and the protection circuit 206 (i.e., the source terminal of the seventh transistor T7), and configured to receive the first bias voltage VB1. The tenth transistor T10 further has a source terminal that is coupled with the fourth resistor R4 and the first capacitor C1, and configured to receive the second reference voltage VR2. The tenth transistor T10 further has a drain terminal that is coupled with the gate terminal of the ninth transistor T9, and configured to generate the second output voltage VO2. In one example, when the first input voltage VI1 is '0.75' volts and the second input voltage VI2 is '0' volts, the first bias voltage VB1 is '0' volts and the second bias voltage VB2 is '1.65–Vt' volts and thus the ninth transistor T9 is in a non-conducting state and the tenth transistor T10 is in a conducting state. As a result, the tenth transistor T10 outputs the second reference voltage VR2 (i.e., '1.65' volts) as the second output voltage VO2, and the ninth transistor T9 outputs the first bias voltage VB1 (i.e., '0' volts) as the first output voltage VO1 such that the first and second output voltages VO1 and VO2 reach minimum and maximum voltage levels (i.e., '0' volts and '1.65' volts, respectively) of the second voltage domain. In one example, the ninth and tenth transistors T9 and T10 are PMOS transistors.

Figure 3:
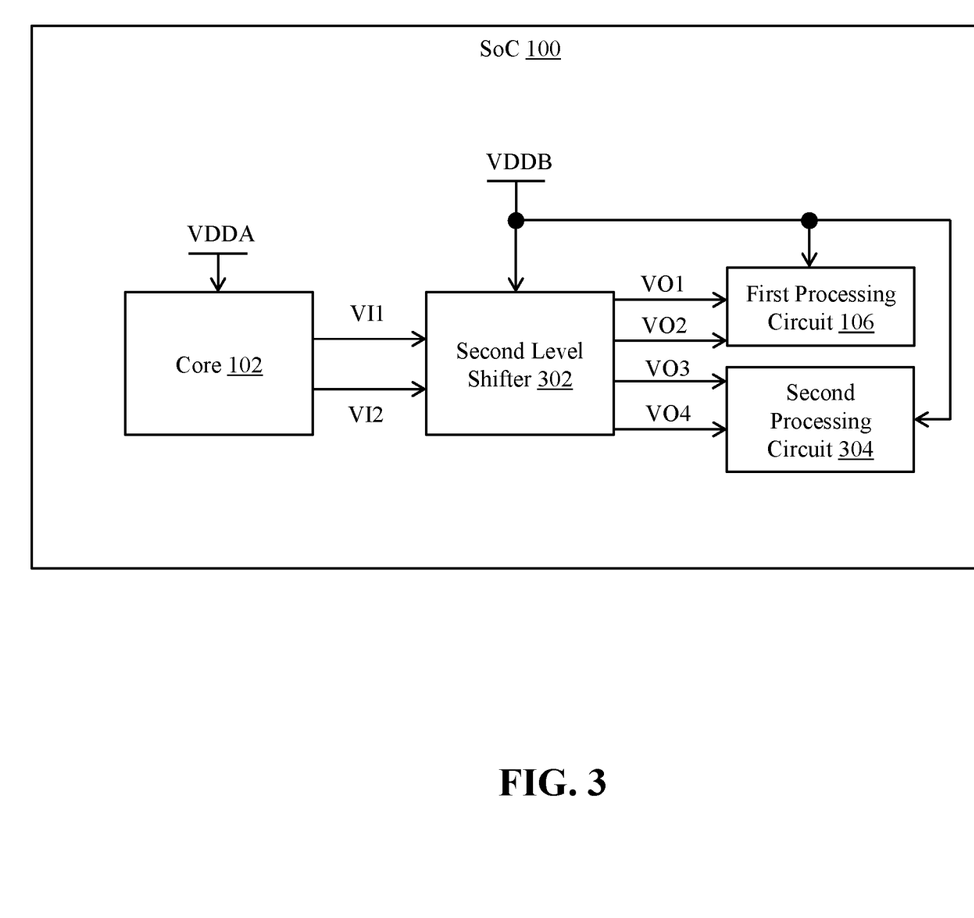
FIG. 3 is a schematic block diagram of the SoC of FIG. 1 in accordance with another embodiment of the present disclosure.

FIG. 3 is a schematic block diagram of the SoC 100 in accordance with another embodiment of the present disclosure. The SoC 100 includes the core 102, a second level shifter 302, the first processing circuit 106, and a second processing circuit 304. The core 102 functions in a similar manner as described in FIG. 1.

The second level shifter 302 is coupled with the core 102, and configured to receive the second supply voltage VDDB such that the second level shifter 302 is configured to operate at the second supply voltage VDDB. The second level shifter 302 is further configured to receive the first and second input voltages VI1 and VI2, and shift voltage levels of the first and second input voltages VI1 and VI2 to generate a plurality of output voltages, i.e., the first and second output voltages VO1 and VO2 and third and fourth output voltages VO3 and VO4. In one example, the second supply voltage VDDB is '1.8' volts. The first and second output voltages VO1 and VO2 are associated with the second voltage domain, and the third and fourth output voltages VO3 and VO4 are associated with a third voltage domain. In one example, the second voltage domain corresponds to voltages in the range of '0-1.65' volts and the third voltage domain corresponds to voltages in the range of '0.35-1.8' volts. The second level shifter 302 has been explained in detail in FIG. 4.

The first processing circuit 106 functions in a similar manner as described in FIG. 1. The second processing circuit 304 is coupled with the second level shifter 302, and configured to receive the third and fourth output voltages VO3 and VO4. The second processing circuit 304 is further coupled with the second supply generator, and further configured to receive the second supply voltage VDDB. In one embodiment, the second processing circuit 304 may be structurally similar to the first processing circuit 106. In one example, the first and second processing circuits 106 and 304 include transistors (not shown) such that the transistors are controlled based on the first through fourth output voltages VO1-VO4 for executing various operations associated with the SoC 100.

Figure 4:
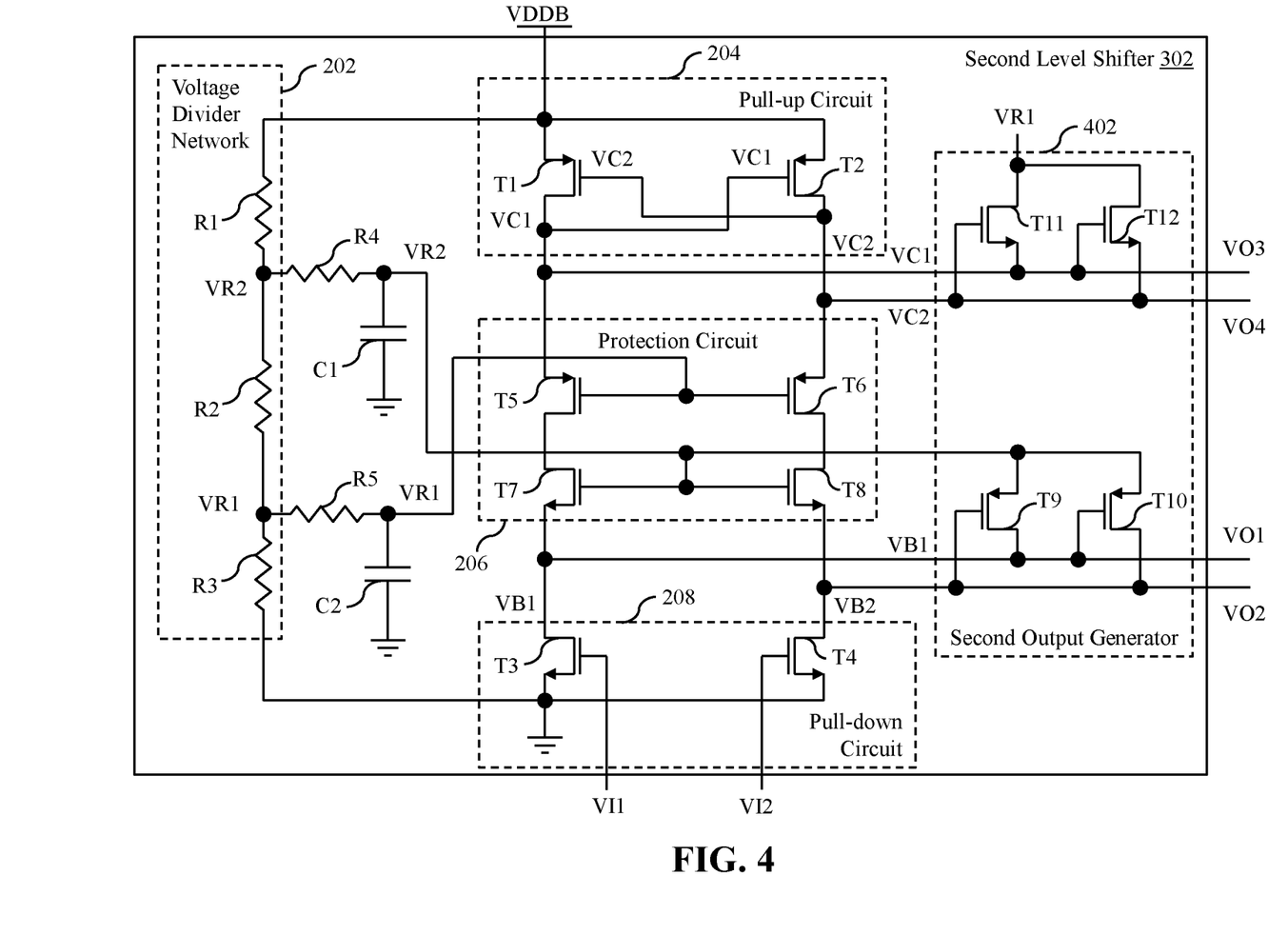
FIG. 4 is a schematic block diagram of a second level shifter of the SoC of FIG. 3 in accordance with another embodiment of the present disclosure.

FIG. 4 is a schematic block diagram of the second level shifter 302 in accordance with another embodiment of the present disclosure. The second level shifter 302 includes the voltage divider network 202 that includes the first through third resistors R1-R3 coupled in series, the fourth resistor R4, the first capacitor C1, a fifth resistor R5, a second capacitor C2, the pull-up circuit 204, the protection circuit 206, the pull-down circuit 208, and a second output generator 402.

The voltage divider network 202 is coupled with the second supply generator, and configured to receive the second supply voltage VDDB and generate the first and second reference voltages VR1 and VR2. The voltage divider network 202 is further coupled with the protection circuit 206 and the second output generator 402, and further configured to provide the first and second reference voltages VR1 and VR2 to the protection circuit 206 and the second output generator 402.

The first through third resistors R1-R3, the fourth resistor R4, and the first capacitor C1 function in a similar manner as described in FIG. 2. The fifth resistor R5 is coupled with the voltage divider network 202, and configured to receive the second reference voltage VR2. The second capacitor C2 is coupled with the fifth resistor R5 and the ground terminal, and configured to charge to the first reference voltage VR1. The fifth resistor R5 and the second capacitor C2 are utilized to prevent back coupling of the third and fourth output voltages VO3 and VO4 due to transitions in the third and fourth output voltages VO3 and VO4. The pull-up circuit 204, the pull-down circuit 208, and the protection circuit 206 function in a similar manner as described in FIG. 2.

The second output generator 402 is coupled with the pull-up circuit 204, the pull-down circuit 208, and the protection circuit 206, and configured to receive the first and second reference voltages VR1 and VR2, the first and second bias voltages VB1 and VB2, and the first and second control voltages VC1 and VC2, and generate the first through fourth output voltages VO1-VO4. The second output generator 402 includes the ninth and tenth transistors T9 and T10 and eleventh and twelfth transistors T11 and T12. The ninth and tenth transistors T9 and T10 function in a similar manner as described in FIG. 2.

The eleventh transistor T11 has a gate terminal that is coupled with the pull-up circuit 204 (i.e., the drain terminal of the second transistor T2) and the protection circuit 206 (i.e., the source terminal of the sixth transistor T6), and configured to receive the second control voltage VC2. The eleventh transistor T11 further has a drain terminal that is coupled with the fifth resistor R5 and the second capacitor C2, and configured to receive the first reference voltage VR1, and a source terminal that is configured to output the third output voltage VO3. Based on the second control voltage VC2 received at the gate terminal of the eleventh transistor T11, the first reference voltage VR1 flows from the drain terminal of the eleventh transistor T11 to the source terminal of the eleventh transistor T11.

The twelfth transistor T12 has a gate terminal that is coupled with the source terminal of the eleventh transistor T11, the pull-up circuit 204 (i.e., the drain terminal of the first transistor T1), and the protection circuit 206 (i.e., the source terminal of the fifth transistor T5), and configured to receive the first control voltage VC1. The twelfth transistor T12 further has a drain terminal that is coupled with the fifth resistor R5 and the second capacitor C2, and configured to receive the first reference voltage VR1. Further, the twelfth transistor T12 has a source terminal that is coupled with the gate terminal of the eleventh transistor T11, and configured to output the fourth output voltage VO4. Based on the first control voltage VC1 received at the gate terminal of the twelfth transistor T12, the first reference voltage VR1 flows from the drain terminal of the twelfth transistor T12 to the source terminal of the twelfth transistor T12. In one example, when the first input voltage VI1 is '0.75' volts and the second input voltage VI2 is '0' volts, the first control voltage VC1 is '0.35+Vt' volts and the second control voltage VC2 is '1.8' volts and thus the eleventh transistor T11 is in a conducting state and the twelfth transistor T12 is in a non-conducting state. As a result, the eleventh transistor T11 outputs the first reference voltage VR1 (i.e., '0.35' volts) as the third output voltage VO3, and the twelfth transistor T12 outputs the second control voltage VC2 (i.e., '1.8' volts) as the fourth output voltage VO4 such that the third and fourth output voltages VO3 and VO4 reach minimum and maximum voltage levels (i.e., '0.35' volts and '1.8' volts, respectively) of the third voltage domain. In one example, the eleventh and twelfth transistors T11 and T12 are NMOS transistors. It will be apparent to a person skilled in the art that a third level shifter (not shown) may be obtained by including a third output generator (not shown) that includes the eleventh and twelfth transistors T11 and T12 in place of the second output generator 402, in the second level shifter 302. The third output generator is thus configured to receive the first reference voltage VR1 and the first and second control voltages VC1 and VC2, and generate the third and fourth output voltages VO3 and VO4. The working of the third level shifter is similar to the second level shifter 302 and will be understood by a person skilled in the art.

As the first and second output voltages VO1 and VO2 are generated by the first output generator 210 (as explained in FIG. 2) and the first through fourth output voltages VO1-VO4 are generated by the second output generator 402 (as explained in FIG. 4), the first and second output voltages VO1 and VO2 are able to reach the minimum and maximum voltage levels associated with the second voltage domain whereas the first through fourth output voltages VO1-VO4 are able to reach the minimum and maximum voltage levels associated with one of the second and third voltage domains. Further, the first through fourth output voltages VO1-VO4 are based on the second and first bias voltages VB2 and VB1 and the second and first control voltages VC2 and VC1 received at the gate terminals of the ninth through twelfth transistors T9-T12, respectively, and the first and second reference voltages VR1 and VR2. Thus, the first through fourth output voltages VO1-VO4 are not directly based on an internal voltage drop associated with the ninth through twelfth transistors T9-T12, respectively, and remain unaffected due to variations in process, voltage, and temperature (PVT) associated with the first and second level shifters 104 and 302. Hence, a need to utilize large-sized transistors in the protection circuit 206 is eliminated and a size of the first and second level shifters 104 and 302 is reduced as compared to conventional level shifters that utilize large-sized transistors in a protection circuit of the conventional level shifters to compensate for PVT variations. Due to the reduced size, the first and second level shifters 104 and 302 operate at a higher speed as compared to the conventional level shifters.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A level shifter, comprising:
   a pull-down circuit that is configured to receive first and second input voltages, and generate first and second bias voltages, wherein the first and second input voltages are associated with a first voltage domain;
   a pull-up circuit that is configured to receive a supply voltage and generate first and second control voltages;
   a protection circuit that is coupled between the pull-down circuit and the pull-up circuit, and configured to receive first and second reference voltages, and control the generation of the first and second bias voltages and the first and second control voltages; and
   an output generator that is coupled with the pull-down circuit and the protection circuit, and configured to receive the second reference voltage and the first and second bias voltages, and generate first and second output voltages, wherein the first and second output voltages are associated with a second voltage domain, wherein the output generator comprises:
      a first transistor that has (i) a gate terminal coupled with the pull-down circuit and the protection circuit, and configured to receive the second bias voltage, (ii) a source terminal configured to receive the second reference voltage, and (iii) a drain terminal configured to generate the first output voltage; and
      a second transistor that has (i) a gate terminal coupled with the drain terminal of the first transistor, the pull-down circuit, and the protection circuit, and configured to receive the first bias voltage, (ii) a source terminal configured to receive the second reference voltage, and (iii) a drain terminal coupled with the gate terminal of the first transistor, and configured to generate the second output voltage.

2. The level shifter of claim 1, wherein the pull-down circuit comprises:
   a first transistor that has (i) a gate terminal configured to receive the first input voltage, (ii) a source terminal coupled with a ground terminal, and (iii) a drain terminal configured to generate the first bias voltage; and
   a second transistor that has (i) a gate terminal configured to receive the second input voltage, (ii) a source terminal coupled with the ground terminal, and (iii) a drain terminal configured to generate the second bias voltage.

3. The level shifter of claim 1, wherein the pull-up circuit comprises:
   a first transistor that has (i) a gate terminal configured to receive the second control voltage, (ii) a source terminal configured to receive the supply voltage, and (iii) a drain terminal configured to generate the first control voltage; and
   a second transistor that has (i) a gate terminal coupled with the drain terminal of the first transistor of the pull-up circuit, and configured to receive the first control voltage, (ii) a source terminal configured to receive the supply voltage, and (iii) a drain terminal coupled with the gate terminal of the first transistor of the pull-up circuit, and configured to generate and provide the second control voltage to the gate terminal of the first transistor.

4. The level shifter of claim 1, wherein the protection circuit comprises:
   a first transistor that has (i) a gate terminal configured to receive the first reference voltage, and (ii) a source terminal coupled with the pull-up circuit, and configured to control the generation of the first control voltage;
   a second transistor that has (i) a gate terminal configured to receive the first reference voltage, and (ii) a source terminal coupled with the pull-up circuit, and configured to control the generation of the second control voltage;
   a third transistor that has (i) a gate terminal configured to receive the second reference voltage, (ii) a source terminal coupled with the pull-down circuit, and configured to control the generation of the first bias voltage, and (iii) a drain terminal coupled with a drain terminal of the first transistor of the protection circuit; and
   a fourth transistor that has (i) a gate terminal configured to receive the second reference voltage, (ii) a source terminal coupled with the pull-down circuit, and configured to control the generation of the second bias voltage, and (iii) a drain terminal coupled with a drain terminal of the second transistor of the protection circuit.

5. The level shifter of claim 1, further comprising a voltage divider network that is coupled with the protection circuit and the output generator, and configured to receive the supply voltage, generate the first and second reference voltages, and provide (i) the first and second reference voltages to the protection circuit, and (ii) the second reference voltage to the output generator.

6. The level shifter of claim 5, wherein the voltage divider network comprises first through third resistors coupled in series, wherein the first resistor is configured to receive the supply voltage and the third resistor is coupled with a ground terminal, and wherein the first and second reference voltages are generated based on a voltage drop across each of the first through third resistors.

7. The level shifter of claim 5, further comprising:
   a resistor that is coupled with the voltage divider network, and configured to receive the second reference voltage; and
   a capacitor that is coupled with the resistor and a ground terminal, and configured to charge to the second reference voltage.

8. A level shifter, comprising:
   a pull-down circuit that is configured to receive first and second input voltages, and generate first and second bias voltages, wherein the first and second input voltages are associated with a first voltage domain;
   a pull-up circuit that is configured to receive a supply voltage and generate first and second control voltages;
   a protection circuit that is coupled between the pull-down circuit and the pull-up circuit, and configured to receive first and second reference voltages, and control the generation of the first and second bias voltages and the first and second control voltages; and
   an output generator that is coupled with the pull-down circuit, the pull-up circuit, and the protection circuit, and configured to receive the first and second reference voltages, the first and second bias voltages, and the first and second control voltages, and generate first through fourth output voltages, wherein the first and second output voltages are associated with a second voltage domain, and the third and fourth output voltages are associated with a third voltage domain, wherein the output generator comprises:
- a first transistor that has (i) a gate terminal coupled with the pull-down circuit and the protection circuit, and configured to receive the second bias voltage, (ii) a source terminal configured to receive the second reference voltage, and (iii) a drain terminal configured to generate the first output voltage; and
- a second transistor that has (i) a gate terminal coupled with the drain terminal of the first transistor, the pull-down circuit, and the protection circuit, and configured to receive the first bias voltage, (ii) a source terminal configured to receive the second reference voltage, and (iii) a drain terminal coupled with the gate terminal of the first transistor, and configured to generate the second output voltage.

9. The level shifter of claim 8, wherein the pull-down circuit comprises:
- a first transistor that has (i) a gate terminal configured to receive the first input voltage, (ii) a source terminal coupled with a ground terminal, and (iii) a drain terminal configured to generate the first bias voltage; and
- a second transistor that has (i) a gate terminal configured to receive the second input voltage, (ii) a source terminal coupled with the ground terminal, and (iii) a drain terminal configured to generate the second bias voltage.

10. The level shifter of claim 8, wherein the pull-up circuit comprises:
- a first transistor that has (i) a gate terminal configured to receive the second control voltage, (ii) a source terminal configured to receive the supply voltage, and (iii) a drain terminal configured to generate the first control voltage; and
- a second transistor that has (i) a gate terminal coupled with the drain terminal of the first transistor of the pull-up circuit, and configured to receive the first control voltage, (ii) a source terminal configured to receive the supply voltage, and (iii) a drain terminal coupled with the gate terminal of the first transistor of the pull-up circuit, and configured to generate and provide the second control voltage to the gate terminal of the first transistor of the pull-up circuit.

11. The level shifter of claim 8, wherein the protection circuit comprises:
- a first transistor that has (i) a gate terminal configured to receive the first reference voltage, and (ii) a source terminal coupled with the pull-up circuit, and configured to control the generation of the first control voltage;
- a second transistor that has (i) a gate terminal configured to receive the first reference voltage, and (ii) a source terminal coupled with the pull-up circuit, and configured to control the generation of the second control voltage;
- a third transistor that has (i) a gate terminal configured to receive the second reference voltage, (ii) a source terminal coupled with the pull-down circuit, and configured to control the generation of the first bias voltage, and (iii) a drain terminal coupled with a drain terminal of the first transistor of the protection circuit; and
- a fourth transistor that has (i) a gate terminal configured to receive the second reference voltage, (ii) a source terminal coupled with the pull-down circuit, and configured to control the generation of the second bias voltage, and (iii) a drain terminal coupled with a drain terminal of the second transistor of the protection circuit.

12. The level shifter of claim 8, wherein the output generator further comprises:
- a third transistor that has (i) a gate terminal coupled with the pull-up circuit and the protection circuit, and configured to receive the second control voltage, (ii) a source terminal configured to output the third output voltage, and (iii) a drain terminal configured to receive the first reference voltage; and
- a fourth transistor that has (i) a gate terminal coupled with the source terminal of the third transistor, the pull-up circuit, and the protection circuit, and configured to receive the first control voltage, (ii) a source terminal coupled with the gate terminal of the third transistor, and configured to output the fourth output voltage, and (iii) a drain terminal configured to receive the first reference voltage.

13. The level shifter of claim 8, further comprising a voltage divider network that is coupled with the protection circuit and the output generator, and configured to receive the supply voltage, generate the first and second reference voltages, and provide the first and second reference voltages to the protection circuit and the output generator.

14. The level shifter of claim 13, wherein the voltage divider network comprises first through third resistors coupled in series, wherein the first resistor is configured to receive the supply voltage and the third resistor is coupled with a ground terminal, and wherein the first and second reference voltages are generated based on a voltage drop across each of the first through third resistors.

15. The level shifter of claim 13, further comprising:
- a resistor that is coupled with the voltage divider network, and configured to receive the second reference voltage; and
- a capacitor that is coupled with the resistor and a ground terminal, and configured to charge to the second reference voltage.

16. The level shifter of claim 13, further comprising:
- a resistor that is coupled with the voltage divider network, and configured to receive the first reference voltage; and
- a capacitor that is coupled with the resistor and a ground terminal, and configured to charge to the first reference voltage.

17. A level shifter, comprising:
- a pull-down circuit that is configured to receive first and second input voltages, and generate first and second bias voltages, wherein the first and second input voltages are associated with a first voltage domain;
- a pull-up circuit that is configured to receive a supply voltage and generate first and second control voltages;
- a protection circuit that is coupled between the pull-down circuit and the pull-up circuit, and configured to receive first and second reference voltages, and control the generation of the first and second bias voltages and the first and second control voltages; and
- an output generator that is coupled with the pull-down circuit, the pull-up circuit, and the protection circuit, and configured to receive the first and second reference voltages, the first and second bias voltages, and the first and second control voltages, and generate first through fourth output voltages, wherein the first and second output voltages are associated with a second voltage domain, and the third and fourth output voltages are associated with a third voltage domain, wherein the output generator comprises:
- a first transistor that has (i) a gate terminal coupled with the pull-up circuit and the protection circuit, and configured to receive the second control voltage, (ii) a drain terminal configured to receive the first reference voltage, and (iii) a source terminal configured to output the third output voltage; and
- a second transistor that has (i) a gate terminal coupled with the source terminal of the first transistor, the pull-up circuit, and the protection circuit, and configured to receive the first control voltage, (ii) a drain terminal configured to receive the first reference voltage, and (iii) a source terminal coupled with the gate terminal of the first transistor, and configured to output the fourth output voltage.

18. The level shifter of claim 17, wherein the pull-up circuit comprises:
- a first transistor that has (i) a gate terminal configured to receive the second control voltage, (ii) a source terminal configured to receive the supply voltage, and (iii) a drain terminal configured to generate the first control voltage; and
- a second transistor that has (i) a gate terminal coupled with the drain terminal of the first transistor of the pull-up circuit, and configured to receive the first control voltage, (ii) a source terminal configured to receive the supply voltage, and (iii) a drain terminal coupled with the gate terminal of the first transistor of the pull-up circuit, and configured to generate and provide the second control voltage to the gate terminal of the first transistor of the pull-up circuit.

19. The level shifter of claim 17, wherein the protection circuit comprises:
- a first transistor that has (i) a gate terminal configured to receive the first reference voltage, and (ii) a source terminal coupled with the pull-up circuit, and configured to control the generation of the first control voltage;
- a second transistor that has (i) a gate terminal configured to receive the first reference voltage, and (ii) a source terminal coupled with the pull-up circuit, and configured to control the generation of the second control voltage;
- a third transistor that has (i) a gate terminal configured to receive the second reference voltage, (ii) a source terminal coupled with the pull-down circuit, and configured to control the generation of the first bias voltage, and (iii) a drain terminal coupled with a drain terminal of the first transistor of the protection circuit; and
- a fourth transistor that has (i) a gate terminal configured to receive the second reference voltage, (ii) a source terminal coupled with the pull-down circuit, and configured to control the generation of the second bias voltage, and (iii) a drain terminal coupled with a drain terminal of the second transistor of the protection circuit.

20. The level shifter of claim 17, further comprising a voltage divider network that is coupled with the protection circuit and the output generator, and configured to receive the supply voltage, generate the first and second reference voltages, and provide the first and second reference voltages to the protection circuit and the output generator.

21. A system-on-chip (SoC), comprising:
- a core that is configured to receive a first supply voltage and generate first and second input voltages, wherein the first and second input voltages are associated with a first voltage domain; and
- a level shifter that is coupled with the core, wherein the level shifter comprises:
  - a pull-down circuit that is configured to receive the first and second input voltages, and generate first and second bias voltages;
  - a pull-up circuit that is configured to receive a second supply voltage and generate first and second control voltages;
  - a protection circuit that is coupled between the pull-down circuit and the pull-up circuit, and configured to receive first and second reference voltages, and control the generation of the first and second bias voltages and the first and second control voltages; and
  - an output generator that is coupled with the pull-up circuit, the pull-down circuit, and the protection circuit, and configured to receive the first and second bias voltages and one of (i) the second reference voltage and (ii) the first and second reference voltages and the first and second control voltages, and generate a plurality of output voltages, wherein the plurality of output voltages are associated with at least one of second and third voltage domains;
  - wherein when the output generator receives the second reference voltage, the output generator generates first and second output voltages of the plurality of output voltages, and when the output generator receives the first and second reference voltages and the first and second control voltages, the output generator generates the first and second output voltages and third and fourth output voltages of the plurality of output voltages, and wherein the first and second output voltages are associated with the second voltage domain, and the third and fourth output voltages are associated with the third voltage domain.

* * * * *